United States Patent [19]

Ooms

[11] Patent Number: 4,585,957
[45] Date of Patent: Apr. 29, 1986

[54] DIODE LOAD EMITTER COUPLED LOGIC CIRCUITS

[75] Inventor: William J. Ooms, Ft. Lauderdale, Fla.

[73] Assignee: Motorola Inc., Schaumburg, Ill.

[21] Appl. No.: 488,333

[22] Filed: Apr. 25, 1983

[51] Int. Cl.[4] ............... H03K 19/013; H03K 19/086; H03K 3/289

[52] U.S. Cl. .................. 307/455; 307/272 A; 307/292; 307/480; 307/317 A; 377/108; 377/111; 377/120

[58] Field of Search ............ 307/272 A, 291, 292, 307/455, 467, 480, 317 A; 377/108, 110, 111, 120

[56] References Cited

U.S. PATENT DOCUMENTS

| | | | |
|---|---|---|---|
| 3,622,810 | 11/1971 | Sasaki | 307/272 A |
| 3,886,531 | 5/1975 | McNeill | 307/291 |
| 3,917,959 | 11/1975 | Swiatowiec et al. | 307/223 R |
| 3,942,033 | 3/1976 | Swiatowiec et al. | 307/215 |
| 3,978,347 | 8/1976 | Hollstein | 307/215 |
| 4,095,189 | 6/1978 | Tai | 330/265 |
| 4,118,621 | 10/1978 | Monticelli et al. | 250/214 A |
| 4,122,401 | 10/1978 | Sauer | 330/257 |
| 4,165,470 | 8/1979 | Fulkerson | |
| 4,215,418 | 7/1980 | Muramatsu | 307/455 |
| 4,253,034 | 2/1981 | Rydval et al. | 307/292 |
| 4,258,330 | 3/1981 | Kaneko et al. | 330/257 |
| 4,308,470 | 12/1981 | Regnier | 307/292 |
| 4,316,151 | 2/1982 | Ooms | 331/1 A |
| 4,325,031 | 4/1982 | Ooms et al. | 331/1 A |
| 4,353,000 | 10/1982 | Noda | 307/490 |
| 4,353,039 | 10/1982 | Huntley | 331/113 R |

FOREIGN PATENT DOCUMENTS 940308 6/1982 U.S.S.R. .

OTHER PUBLICATIONS

"Modeling the Bipolar Transistor" by Ian Getreu (Tektronix, Inc. Beaverton, Oregon, (p. #52).
"Bipolar Dynamic Memory Cell" by Horst H. Henn, IEEE Journal of Solid State Circuits, SC-6, No. 5, pp. 297 and 299, Oct. 1971.
"Low-Power Bipolar Transistor Memory Cell" by David A. Hodges et al., IEEE Journal of Solid State Circuits, SC-4, No. 5, pp. 280 and 281, Oct., 1969.
"IEEE Journal of Solid State Circuits," SC-14, No. 5, p. 830, Oct., 1979.
"A Wide-Band Current-Controlled Oscillator Using Bipolar-JFET Transistors" by Frans V. J. Sleeckx et al., IEEE Journal of Solid State Circuits, SC-15, No. 5, pp. 875 and 876, Oct. 1980.
"An Integrated Micropower Low-Voltage Temperature-Controlled Oscillator" by David VanMaaren et al., IEEE Journal of Solid State Circuits, SC-17, No. 6, pp. 1197, 1198 and 1201, Dec., 1982.

Primary Examiner—John Zazworsky
Attorney, Agent, or Firm—Rolland Hackbart

[57] ABSTRACT

Diode load emitter coupled logic circuits is described that utilizes forward biased diodes in the load circuits. The load circuits may be comprised of a single diode or two or more diodes connected in series. If a single diode is used in the load circuits, the slope factor of the diode must be greater than or equal to the slope factor of switching transistors in the logic circuit. External bias circuitry provides a bias current which can be varied for varying the frequency of operation of the logic circuit. High speeds at low power dissipations can be obtained since the switching transistors in the logic circuits do not switch completely on and off.

12 Claims, 12 Drawing Figures

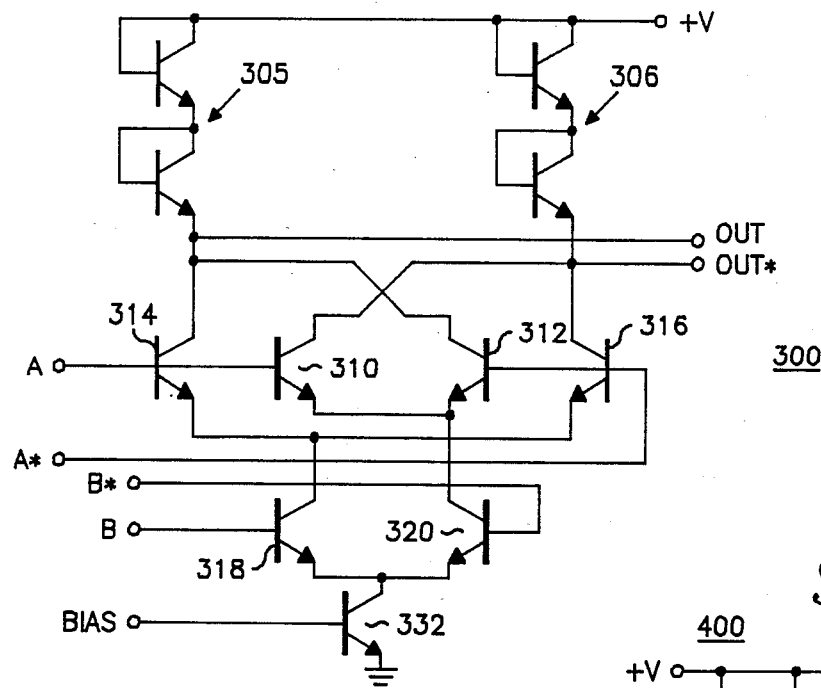
*Fig. 3*
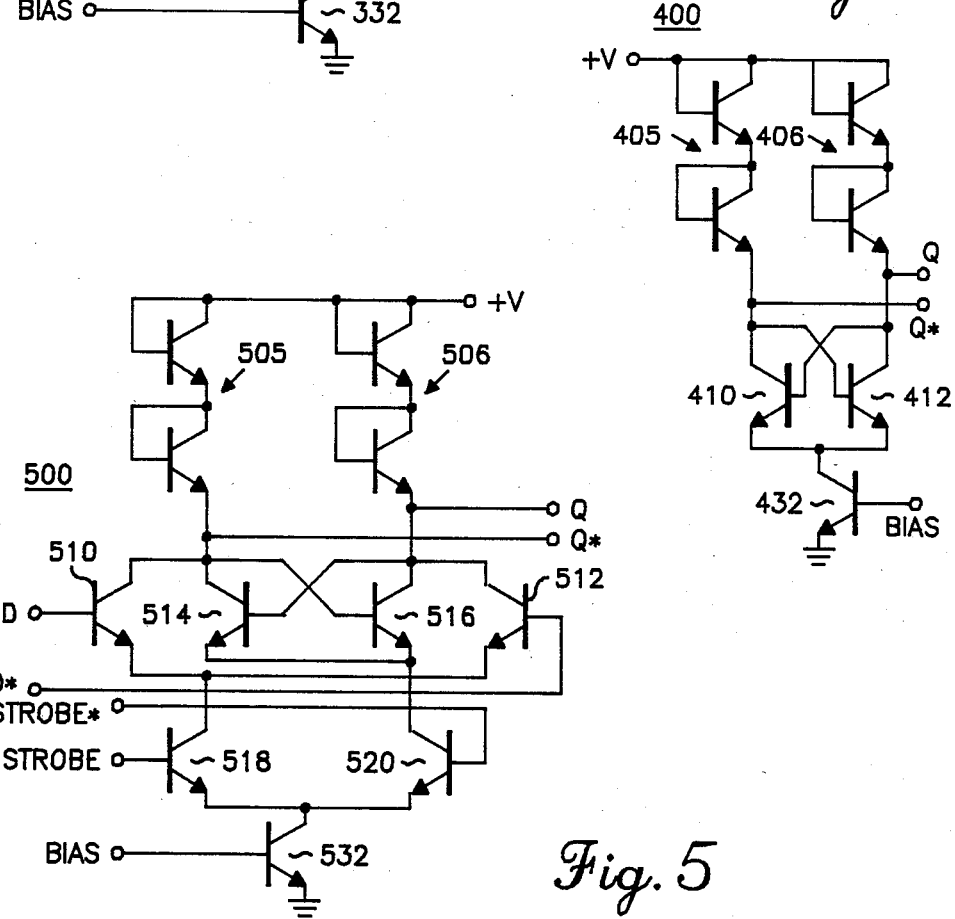
*Fig. 4*
*Fig. 5*

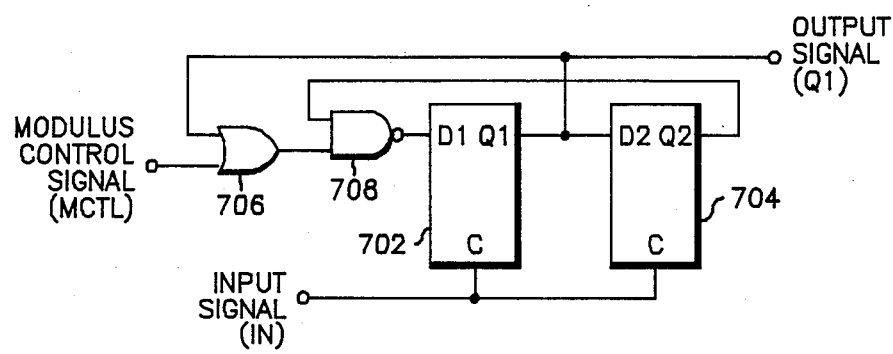
Fig. 7
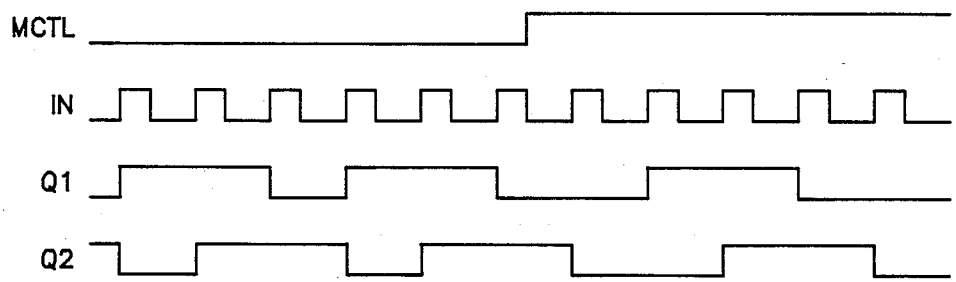
Fig. 8
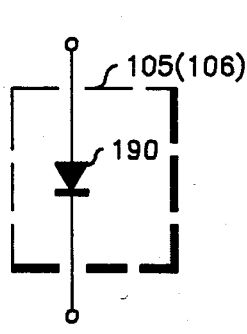 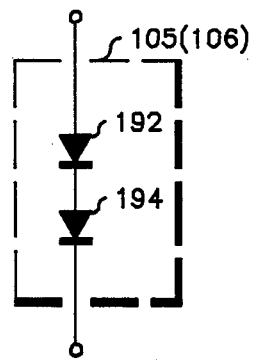 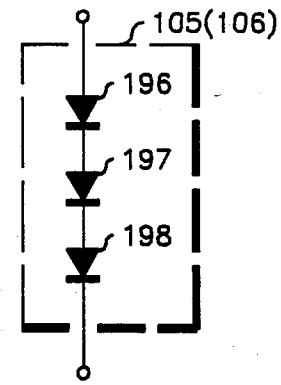
Fig. 10     Fig. 11     Fig. 12

DIODE LOAD EMITTER COUPLED LOGIC CIRCUITS

BACKGROUND OF THE INVENTION:

The present invention is related generally to emitter coupled logic circuits, and more particularly to high speed emitter coupled logic circuits having diode load circuitry.

In prior art emitter coupled logic circuits, such as that shown and described in U.S. Pat. No. 3,917,959, the load circuitry of the internal switching transistors includes a resistor which is used to provide binary output having a high and low voltage state. However, using a resistor in the load circuit creates a number of problems including temperature stability problems, sensitivity to capacitive loading, limitations in speed of operation and the requirement of a fixed bias current which can only be changed by changing the value of the resistor. The sensitivity to capacitive loading can be decreased somewhat by utilizing a series coupled emitter-follower and diode in addition to a resistor in the load circuit, as illustrated in the aforementioned U.S. Pat. No. 3,917,959. Although such load circuits make it feasible for prior art emitter coupled logic circuits to operate at higher speeds, the maximum speed of operation attainable is limited due to the fact that complete switching is necessary and higher speeds of operation result in relatively high power dissipation. Both high speed operation and at the same time, relatively low power dissipation is required in many applications, such as in high speed dual modulus prescalers utilized in frequency synthesizers used in direct FM radios.

OBJECTS AND SUMMARY OF THE INVENTION

Accordingly, it is an object of the present invention to provide improved diode load emitter coupled logic circuits that are capable of relatively high speed operation at relatively low power dissipations.

It is another object of the present invention to provide improved diode load emitter coupled logic circuits whose bias current can be externally varied for varying its frequency of operation.

It is a further object of the present invention to provide improved diode load emitter coupled logic circuits that exhibit improved temperature stability.

Briefly described, the present invention encompasses emitter coupled circuitry that includes first and second switching transistors each having emitter terminals intercoupled to one another and further coupled to biasing circuitry, base terminals coupled to first and second complementary input signals from a signal source, and output terminals being coupled to first and second load circuitry for providing first and second output signals, respectively. The first and second load circuitry may be comprised of a plurality of series coupled, forward biased diodes or a single, forward biased diode having a slope factor that is greater than one. Since no resistors are used in the diode load emitter coupled circuits of the present invention, higher speeds of operation at lower power dissipations can be attained.

BRIEF DESCRIPTION OF THE DRAWINGS

FIG. 3 is a detailed circuit diagram of another emitter coupled two-input gating circuit embodying the present invention.

FIG. 4 is a detailed circuit diagram of an emitter coupled flip-flop embodying the present invention.

FIG. 5 is a detailed circuit diagram of an emitter coupled latch embodying the present invention.

FIG. 7 is a block diagram of a dual modulus divider.

FIG. 8 illustrates the wave forms provided by corresponding blocks in FIG. 7.

FIG. 10 is an alternative embodiment of load circuits 105 and 106 in FIG. 1.

FIG. 11 is another alternative embodiment of load circuits 105 and 106 in FIG. 1.

FIG. 12 is yet a further alternative embodiment of load circuits 105 and 106 in FIG. 1.

DETAILED DESCRIPTION OF THE PREFERRED EMBODIMENTS

Figure 1:
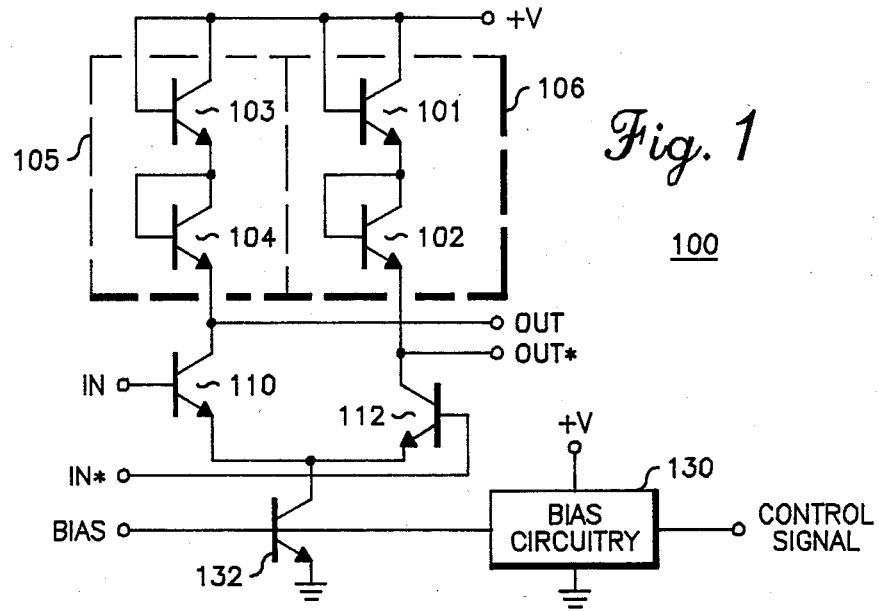
FIG. 1 is a detailed circuit diagram of an emitter coupled inverting circuit embodying the present invention.

Referring to FIG. 1, there is illustrated a diode load emitter coupled inverting circuit 100 embodying the present invention. Inverting circuit 100 is coupled to complementary, or differential, input signals IN and IN*, and generates comlementary output signals OUT and OUT*. The complementary input signals IN and IN* are applied to the base terminals of switching transistors 110 and 112. The emitter terminals of switching transistors 110 and 112 are coupled to the collector terminal of bias transistor 132. A bias current generated by bias circuitry 130 is applied by transistor 132 to switching transistors 110 and 112. Bias circuitry 130 may be any suitable conventional bias circuitry that is responsive to a control signal for providing a variable bias current, labeled "BIAS" throughout the drawings. The bias current provided by bias circuitry 130 can be varied depending on the desired operating frequency of inverting circuit 100. Although shown as a logic circuit, inverting circuit 100 may also be operated as an amplifying circuit. Thus, the present invention encompasses both diode load logic circuits and diode load amplifying circuits.

The collector terminals of switch transistors 110 and 112 in FIG. 1 are connected to novel load circuits 105 and 106, respectivley. Load circuits 105 and 106 are each comprised of two or more transistors 103, 104 and 101, 102, respectively, which are, in essence, diodes since their collector and base terminals are interconnected. According to an important feature of the present invention, the diode load circuits 105 and 106 can be operated at any suitable current and can have matched electrical characteristics by embodying them in a common semiconductive substrate. Furthermore, switching transistors 110 and 112 need not switch completely, and the voltage swing between their on and off states is relativley small, being approximately thirty to one-hundred millivolts. In other words, switching transistors 110 and 112 are preferably operated in the active as opposed to saturated mode. Since switching transistors 110 and 112 do not switch completely, diodes 103 and 104 in load circuit 105 and diodes 101 and 102 in load circuit 106 are always forward biased. As a result, the diode load emitter coupled logic circuits embodying the present invention are capable of relatively high speed operation at relatively low power dissipations.

Diode load circuits 105 and 106 in FIG. 1 each have a slope factor that is greater than or equal to that of switching transistor 110 or 112, assuming transistors 101, 102, 103, 104, 110 and 112 are all formed on the same substrate. The slope factor is the low-current, forward region emission coefficient for a given device or combination of devices (see "Modeling the Bipolar Transistor" by Ian Getreu, published by Textronix, Inc., Beaverton, Oreg., 1976). Referring to FIG. 1, the slope factor of the series-connected transistors 103 and 104 in load circuit 105 is approximately twice as great as the slope factor of switching transistor 110 or 112. Such a condition is necessary in order for inverting circuit 100 to operate properly.

According to a further feature of the present invention, load circuits 105 and 106 in FIG. 1 can be comprised of a single diode 190 as illustrated in FIG. 10, or two diodes 192 and 194 as illustrated in FIG. 11, or three diodes 196, 197 and 198 as illustrated in FIG. 12, provided that the diodes in the load circuits have slope factors that are greater than the slope factor of switching transistor 110 or 112. Assuming that transistors 110 and 112 each have a slope factor of one, a Schottkey diode or polysilicon diode may be used for diode 190 in FIG. 10, since such diodes can have a slope factor between one and two depending on its construction. Thus, a single Schottkey diode or a single polysilicon diode used in load circuits 105 and 106 has a load factor greater than or equal to one. Similarly the series-connected diodes in FIGS. 11 and 12 have a composite slope factor greater than one.

Referring to FIG. 1, the operation of the inverting circuit 100 will be described in more detail. When input signal IN is higher than input signal IN*, switching transistor 110 conducts more current than switching transistor 112, producing a greater current in load 105 than in load 106. If more current is flowing through load 105 than 106, the voltage drop across load 105 is greater than that across load circuit 106. As a result, output signal OUT has a lower voltage than output signal OUT*. The net effect is that output signals OUT and OUT* have an inverted polarity from that of input signals IN and IN*, respectively. Circuit 100 can be rendered non-inverting simply by interchanging the connections of output signals OUT and OUT*.

An expression for the ratio of the currents through switching transistors 110 and 112 in FIG. 1 can be derived from the following basic transistor equation:

$$I_c = I_s \exp(V_{be}/MV_t);$$

where $V_t = kT/q$. The ratio of the currents through transistors 110 and 112 can be expressed as follows for a given voltage difference between input signals IN and IN*:

$$I_{110}/I_{112} = \exp((V_{IN} - V_{IN*})/V_t).$$

Utilizing two series connected transistors for load circuits 105 and 106, the voltage difference between the output signals OUT and OUT* can be expressed as follows:

$$V_{OUT} - V_{OUT*} = -2(V_{IN} - V_{IN*})$$

In other words, the magnitude of the voltage difference between the output signals OUT and OUT* is twice the magnitude of the voltage difference between the input signals IN and IN*.

If a single diode is utilized as load circuit 105 or 106 in FIG. 1, the current through the diode can be characterized as follows:

$$I_D = I_{SD} \exp(V_D/V_T);$$

where M = the diode slope factor. The voltage difference between output signals OUT and OUT* can now be expressed as follows:

$$V_{OUT} - V_{OUT*} = -M(MV_{IN} - V_{IN*}).$$

In order for inverting circuit 100 to have a gain that is greater than unity, the slope factor M of the single diode must be greater than one so that the difference in voltage between the output signals OUT and OUT* is greater than the difference in voltage between the input signals IN and IN*. Therefore, the slope factor of a single diode that is utilized as load circuit 105 and 106 must be greater than or equal to one, assuming that the slope factor of switching transistors 110 and 112 is equal to one.

Figure 2:
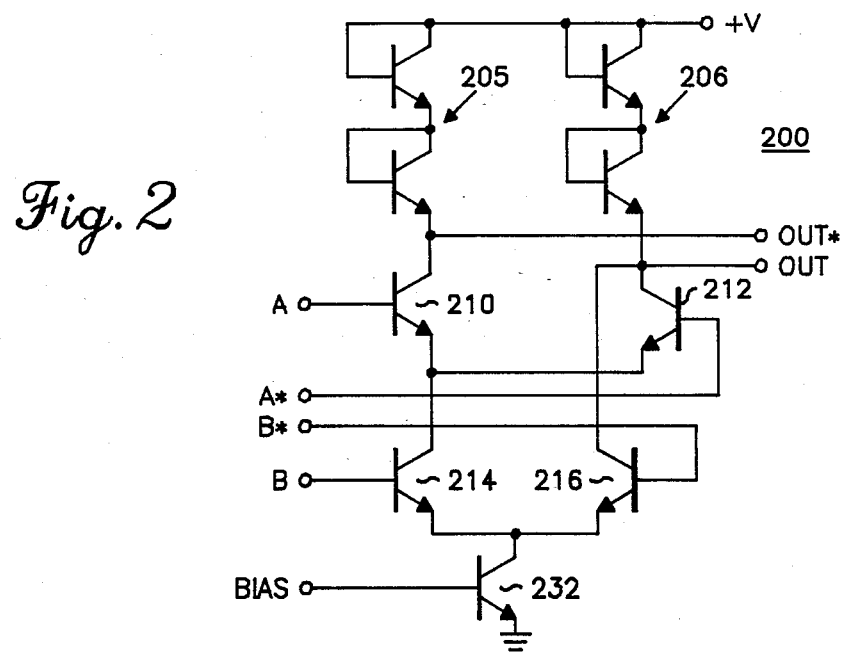
FIG. 2 is a detailed circuit diagram of an emitter coupled two-input gating circuit embodying the present invention.

Referring to FIG. 2, there is illustrated a detailed circuit diagram of an emitter coupled two-input gating circuit 200 embodying the present invention. Load circuits 205 and 206 are substantially identical to load circuits 105 and 106 in FIG. 1. Input signals A and A* are coupled to switching transistors 210 and 212, respectively. Input signals B and B* are coupled to switching transistors 214 and 216, respectively. A bias current is applied by transistor 232 to the emitters of switching transistors 214 and 216.

When two-input gating circuit 200 in FIG. 2 is operating, current through switching transistors 216 and 212 goes directly to load circuit 206, and current through the switching transistor 210 goes directly to load circuit 205. Output signal OUT has a higher voltage than output signal OUT* only if the current through load circuit 205 is greater than the load current through load circuit 206. This condition will only happen when the current through switching transistor 210 is greater than the current through switching transistor 212 (i.e., when input signal A has a higher voltage than A*) and the current through switching transistor 216 (i.e., when input signal B has a higher voltage than input signal B*). Hence, in order for output signal OUT to be higher than output signal OUT*, both input signals A and B must be greater than input signals A* and B*, respectively. In other words, two-input gating circuit 200 is acting as an AND gate. By interchanging the connections of output signals OUT and OUT*, a NAND gate is produced. Also, interchanging the connections of input signals A and A* and input signals B and B* produces a NOR gate, and additionally interchanging the connections of output signals OUT and OUT* produces an OR gate.

Referring to FIG. 3, there is illustrated a detailed circuit diagram of another emitter coupled twoinput gating circuit 300 embodying the present invention. Load circuits 305 and 306 correspond to load circuits 105 and 106 in FIG. 1. Input signals A and A* are coupled to switching transistors 314, 310 and 312, 316, respectively. Input signals B and B* are coupled to switching transistors 318 and 320, respectively. A bias current is applied to the emitters of switching transistors 318 and 320 by transistor 332.

The emitter coupled two-input gating circuit 300 in FIG. 3 operates as an OR gate. Output signal OUT is high, that is greater than output signal OUT*, when the current in load circuit 306 is greater than the current in load circuit 305. If input signal B is high, more current flows through switching transistor 318 than through switching transistor 320. Then, if input signal A is low, a greater current flows through switching transistor 316 than switching transistor 314, producing a greater current in load circuit 306 than load circuit 305. Similarly, if input signal B is low, more current flows through switching transistor 320 than switching transistor 318. Then, if input signal A is high, more current flows through switching transistor 310 than switching transistor 312, producing a greater current in load circuit 306 than load circuit 305. Conversely, if both input signals A and B are low, then a greater current is produced in load circuit 305 than in load circuit 306, and output signal OUT is low, that is lower than output signal OUT*.

Referring to FIG. 4, there is illustrated a detailed circuit diagram of an emitter coupled flip-flop 400 embodying the present invention. Load circuits 405 and 406 correspond to load circuits 105 and 106 in FIG. 1. Switching transistors 410 and 412 are cross-coupled between their collector and base terminals. A bias current is applied to the emitters of switching transistors 410 and 412 by transistor 432.

Emitter coupled flip-flop 400 in FIG. 4 operates as follows, assuming that output signal Q is high, and output signal Q* is low. Under these conditions, the current through switching transistor 410 is greater than that through switching transistor 412, producing a greater current in load circuit 405 than in load circuit 406. Since the current through load circuit 405 is greater than the load circuit 406, output signal Q* is lower than output signal Q (a result consistent wtih the foregoing assumption). Similarly, output signal Q* will be higher than output signal Q if the current through switching transistor 412 is greater than that through switching transistor 410. Both of the foregoing conditions result in stable states of flip-flop 400. Hence, flip-flop 400 operates as a binary storage element.

Referring to FIG. 5, there is illustrated a detailed circuit diagram of an emitter coupled latch 500 embodying the present invention. Load circuits 505 and 506 correspond to load circuits 105 and 106 in FIG. 1. Input signals D and D* are coupled to switching transistor 510 and 512, respectively. Input signals STROBE and STROBE* are coupled to switching transistors 518 and 520, respectively. Switching transistors 514 and 516 have their base and collector terminals cross-coupled with one another. A bias current is applied to the emitters of switching transistors 518 and 520 by transistor 532.

In operation, the emitter coupled latch 500 in FIG. 5 operates as a binary storage element that stores the binary state of input signal D in response to the input signal STROBE. When the input signal STROBE is high, more current flows through switching transistor 518 than switching transistor 520, and switching transistors 510 and 512 apply the input signals D and D*, respectively, to output signals Q and Q*, respectively. When the input signal STROBE* is high, the current through switching transistor 520 is greater than that through switching transistor 518, and switching transistors 514 and 516 act as a flip-flop for storing the output signals Q and Q*. Thus, when the input signal STROBE is high, the input signal D and D* are applied to output signals Q and Q*, and when the input signal STROBE* is high, the output signals Q and Q* are stored.

Figure 6:
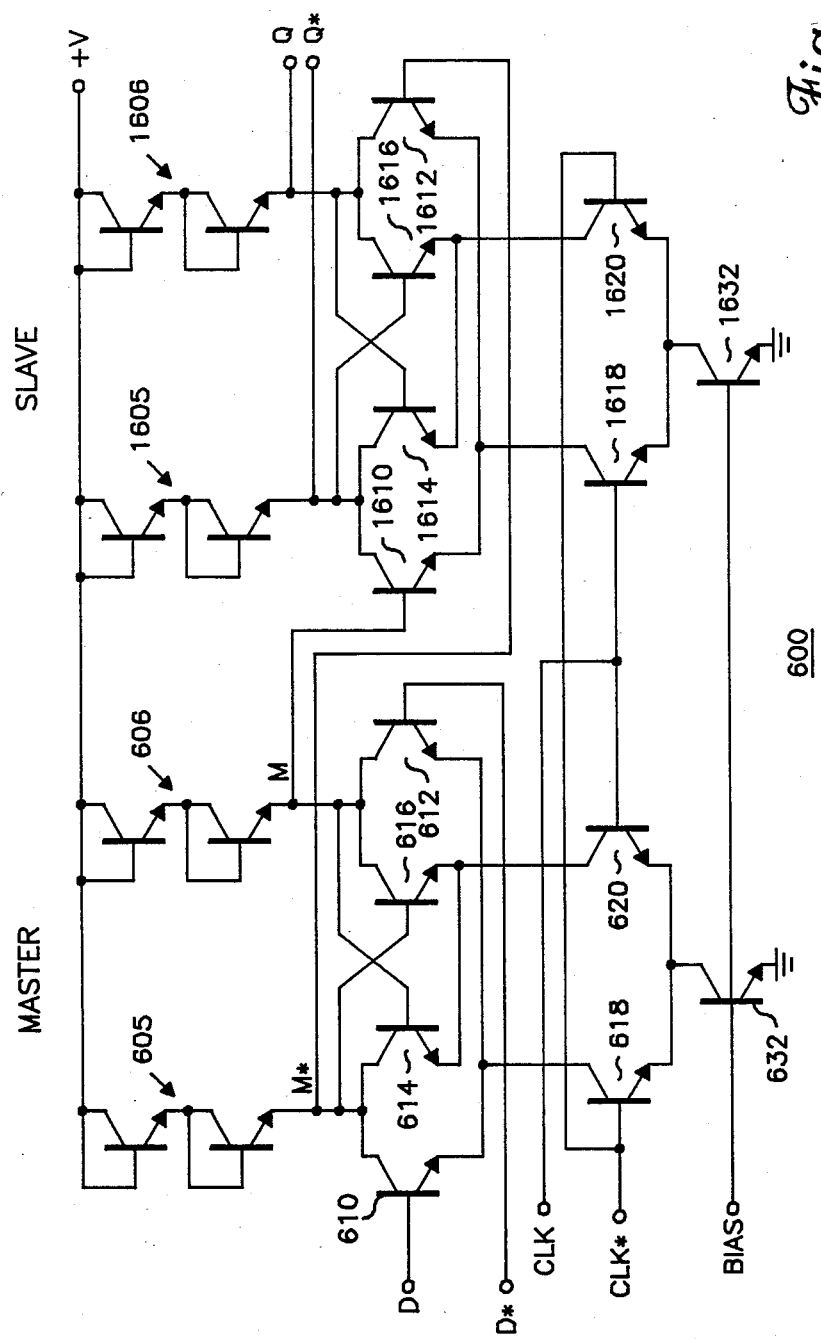
FIG. 6 is a detailed circuit diagram of an emitter coupled D flip-flop embodying the present invention.

Referring to FIG. 6, there is illustrated a detailed circuit diagram of an emitter coupled D flip-flop 600 embodying the present invention. D flip-flop 600 is of the master/slave type, where the master is comprised of elements 605, 606, 610, 612, 614, 616, 618, 620 and 632 and the slave is comprised of elements 1605, 1606, 1610, 1612, 1614, 1616, 1618, 1620, and 1632. The master and the slave are substantially identical to latch 500 in FIG. 5, with the exception that the input signal STROBE is replaced by the input signal CLK. The master produces outputs M and M*, and the slave produces outputs Q and Q*.

In operation of D flip-flop 600 in FIG. 6, the input signals D and D* are gated into the master when CLK is low, and transferred from the master to the slave when CLK is high. That is, when the input signal CLK is lower than input signal CLK*, the input signals D and D* are gated to M and M* by switching transistors 610 and 612, respectively, while at the same time, output signals Q and Q* are stored by switching transistors 1614 and 1616. When CLK is high, the output signals M and M* are stored by switching transistor 614 and 616 and are gated to the output signals Q and Q* by switching transistors 1610 and 1612, respectively.

Referring to FIG. 7, there is illustrated a block diagram of a dual-modulus divider. D flip-flops 702 and 704 are clocked by input signal IN and either operate as a divide by three or a divide by four divider depending on the binary state of the modulus control signal MCTL. The modulus control signal MCTL is coupled to OR gate 706 for changing the feedback signal which is applied to the D input of flip-flop 702 by NAND gate 708. If the modulus control signal MCTL is high, the feedback signal applied to the D input of flip-flop 702 is Q2*. If the modulus control signal MCTL is low, the feedback signal applied to the D input of flip-flop 702 is Q1* or Q2*. Thus, when the modulus control signal MCTL is high, the dual modulus divider divides by four, and when the modulus control signal MCTL is low, the dual modulus divider divides by a modulus of three.

The operation of the dual modulus divider in FIG. 7 can be more easily understood by reference to the waveforms in FIG. 8. The modulus control signal MCTL starts in a low or binary zero state and then changes to a high or binary one state. The input signal IN is a square wave signal having a particular frequency. When the modulus control signal MCTL has a binary zero state, the input signal IN is divided by three. This is illustrated by the waveforms for Q1 and Q2, which have the following repeated sequence of states 01, 10 and 11 when MCTL is low. When the modulus control signal MCTL changes to a binary one state, the input signal IN is divided by four. This is illustrated by the wave forms for Q1 and Q2, which have the following repeated sequence of binary states, 01, 00, 10 and 11 when MCTL is high.

Figure 9:
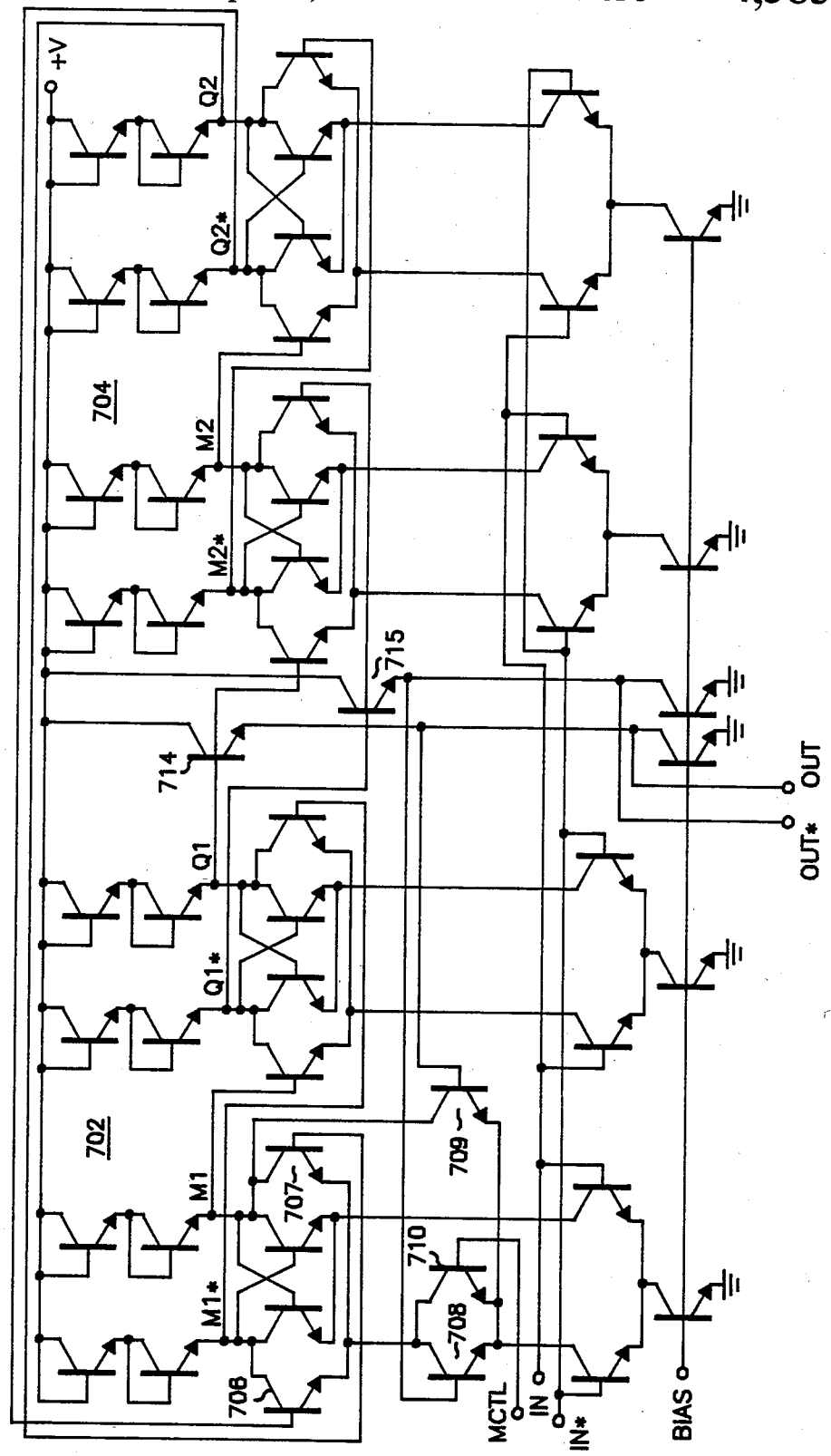
FIG. 9 is a detailed circuit diagram of an embodiment of the dual modulus counter in FIG. 7 which is comprised of diode load emitter coupled logic circuits embodying the present invention.

Referring to FIG. 9, there is illustrated a detailed diagram of an embodiment of the dual modulus counter in FIG. 7, which is comprised of diode load emitter coupled D flip-flops 702 and 704. With the exception of transistors 708, 709, 710, 714 and 715, D flip-flops 702 and 704 are the same as two D flip-flops 600 in FIG. 6 which are connected both in series with one another and to a common clock. Transistor 714 and 715 and their corresponding bias current sources operate as level shifters for applying output signals Q1 and Q1* to switching transistors 709 and 708, respectively. Switching transistors 708 and 710 perform an OR function (corresponding to OR gate 200 in FIG. 2) and switching transistors 708, 709, 706 and 707 perform a NAND function (corresponding to NAND gate 200 in FIG. 2). The operation of the OR and NAND gates was explained hereinabove with respect to FIG. 2. Thus, the OR and NAND functions have been provided in D flip-flop 702 simply by the addition of three more switching transistors 708, 709 and 710. The modulus control signal MCTL is coupled to switching transistor 710. The output of the dual modulus divider in FIG. 9 is taken from transistors 714 and 715. If the output signals OUT and OUT* are to be applied to other circuit devices, additional level shifting and/or amplifying circuits may be required depending on the electrical characteristics of such other circuit devices.

In summary, improved diode load emitter coupled logic circuits have been described that are capable of both relatively high speed operation and relatively low power dissipations. The improved performance of the diode load emitter coupled logic circuits of the present invention has been achieved by utilizing one or more forward biased diodes in the load circuits. Only one diode need be utilized in the load circuits provided that the diode has a slope factor that is greater than or equal to that of the switching transistors used in the logic circuitry. Furthermore, the circuit elements of the diode load emitter coupled logic circuit of the present invention may be formed of electrical circuit elements that are integrated into a semiconductive substrate. The inventive diode load emitter coupled logic circuits can be advantageously utilized in any suitable application that requires both high speed operation and low power dissipation.

What is claimed is:

1. A gating circuit responsive to first and second complementary input signals from a signal source for generating first and second complementary output signals, said circuit comprising:
   first and second switching transistors each having emitter terminals intercoupled to one another, base terminals coupled to said first and second input signals, respectively, and collector terminals providing said first and second output signals, respectively;
   means coupled to the emitter terminals of the first and second switching transistors for generating a predetermined bias current; and
   first and second load means coupled between a power source and collector terminals of the first and second switching transistors, respectively, said first and second load means, respectively, said first and second load means each being comprised of at least two series coupled, forward biased transistors interconnected to one another for continuously conducting current from said power source and each having an emitter terminal, a base terminal and a collector terminal connected to the base terminal.

2. The circuit according to claim 1, wherein said bias current generating means includes means for varying the generated bias current in response to a control signal from a control signal source.

3. A gating circuit responsive to first and second complementary input signals from a first signal source and third and fourth complementary input signals from a second signal source for generating first and second complementary output signals, said circuit comprising:
   first and second switching transistors each having emitter terminals intercoupled to one another, base terminals coupled to said first and second input signals, respectively, and collector terminals providing said first and second output signals, respectively;
   third and fourth switching transistors each having emitter terminals intercoupled to one another, base terminals coupled to said third and fourth input signals, respectively, and collector terminals coupled to the intercoupled emitter terminals of the first and second switching transistors and the output terminal of the second switching transistor, respectively;
   means coupled to the emitter terminals of the third and fourth switching transistors for generating a predetermined bias current; and
   first and second load means coupled between a power source and collector terminals of the first and second switching transistors, respectively, said first and second load means each being comprised of at least two series coupled, forward biased transistors interconnected to one another for continuously conducting current from said power source and each having an emitter terminal, a base terminal and a collector terminal connected to the base terminal.

4. The circuit according to claim 3, wherein said bias current generating means includes means for varying the generated bias current in response to a control signal from a control signal source.

5. A gating circuit responsive to first and second complementary input signals from a first signal source and third and fourth complementary input signals from a second signal source for generating first and second complementary output signals, said circuit comprising:
   first and second switching transistors each having emitter terminals intercoupled to one another, base terminals coupled to said first and second input signals, respectively, and collector terminals providing said first and second output signals, respectively;
   third and fourth switching transistors each having emitter terminals intercoupled to one another, base terminals coupled to said first and second input signals, respectively, and collector terminals coupled to the collector terminals of the second and first switching transistors, respectively;
   fifth and sixth switching transistors each having emitter terminals intercoupled to one another, base terminals coupled to said third and fourth input signals, respectively, and collector terminals coupled to the intercoupled emitter terminals of the first and second switching transistors and the intercoupled emitter terminals of the third and fourth switching transistors, respectively;
   means coupled to the emitter terminals of the fifth and sixth switching transistors for generating a predetermined bias current; and
   first and second load means coupled between a power source and collector terminals of the first and second switching transistors, respectively, said first and second load means each being comprised of at least two series coupled, forward biased transistors interconnected to one another for continuously conducting current from said power source and each having an emitter terminal, a base terminal and a collector terminal connected to the base terminal.

6. The circuit according to claim 5, wherein said bias current generating means includes means for varying the generated bias current in response to a control signal from a control signal source.

7. A gating circuit having first and second complementary output signals for storing first and second complementary input signals from a first signal source in response to first and second complementary strobe signals from a second signal source, said circuit comprising:

first and second switching transistors each having emitter terminals intercoupled to one another, base terminals coupled to said second and first output signals, respectively, and collector terminals providing said first and second output signals, respectively;

third and fourth switching transistors each having emitter terminals intercoupled to one another, base terminals coupled to said first and second input signals, respectively, and collector terminals coupled to the collector terminals of the first and second switching transistors, respectively;

fifth and sixth switching transistors each having emitter terminals intercoupled to one another, base terminals coupled to said first and second strobe signals, respectively, and collector terminals coupled to the intercoupled emitter terminals of the third and fourth switching transistors and the intercoupled emitter terminals of the first and second switching transistors, respectively;

means coupled to the emitter terminals of the fifth and sixth switching transistorss for generating a predetermined bias current; and first and second load means coupled between a power source and collector terminals of the first and second switching transistors, respectively, said first and second load means each being comprised of at least two series coupled, forward biased transistors interconnected to one another for continuously conducting current from said power source and each having an emitter terminal, a base terminal and a collector terminal connected to the base terminal.

8. The circuit according to claim 7, wherein said bias current generating means includes for varying the generated bias current in response to a control signal from a control signal source.

9. A flip-flop circuit having first and second complementary flip-flop output signals for storing first and second complementary flip-flop input signals from a first signal source in response to first and second complementary clock signals from a second signal source, said circuit comprising:

(a) master and slave circuit means, each having first and second complementary input signals and first and second complementary output signals, the first and second slave output signals providing the first and second flip-flop output signals, respectively, the first and second master input signals being coupled to the first and second flip-flop input signals, respectively, and the first and second slave input signals being coupled to the second and first master output signals, respectively;

(b) said master circuit means comprising:

(i) first and second switching transistors each having emitter terminals intercoupled to one another, base terminals coupled to said second and first master output signals, respectively, and collector terminals providing said first and second master output signals, respectively;

(ii) third and fourth switching transistors each having emitter terminals intercoupled to one another, base terminals coupled to said first and second master input signals, respectively, and collector terminals coupled to the collector terminals of the first and second switching transistors, respectively;

(iii) fifth and sixth switching transistors each having emitter terminals intercoupled to one another, base terminals coupled to said first and second clock signals for said slave circuit means and to said second and first clock signals for said master circuit means, respectively, and collector terminals coupled to the intercoupled emitter terminals of the third and fourth switching transistors and the intercoupled emitter terminals of the first and second switching transistors, respectively; and (iv) first and second load means coupled between a power source and collector terminals of the first and second switching transistors, respectively, said first and second load means each being comprised of at least two series coupled, forward biased transistors interconnected to one another for continuously conducting current from said power source and each having an emitter terminal, a base terminal and a collector terminal connected to the base terminal;

(c) said slave circuit means comprising:

(i) first and second switching transistors each having emitter terminals intercoupled to one another, base terminals coupled to said second and first slave output signals, respectively, and collector terminals providing said first and second slave output signals, respectively;

(ii) third and fourth switching transistors each having emitter terminals intercoupled to one another, base terminals coupled to said first and second slave input signals, respectively, and collector terminals coupled to the collector terminals of the first and second switching transistors, respectively;

(iii) fifth and sixth switching transistors each having emitter terminals intercoupled to one another, base terminals coupled to said first and second clock signals for said slave circuit means and to said second and first clock signals for said master circuit means, respectively, and collector terminals coupled to the intercoupled emitter terminals of the third and fourth switching transistors and the intercoupled emitter terminals of the first and second switching transistors, respectively; and (iv) first and second load means coupled between the power source and collector terminals of the first and second switching transistors, respectively, said first and second load means each being comprised of at least two series coupled, forward biased transistors interconnected to one another for continuously conducting current from said power source and each having an emitter terminal, a base terminal and a collector terminal connected to the base terminal; and (d) means coupled to the emitter terminals of the fifth and sixth switching transistors in the master and slave circuit means for generating a predetermined bias current.

10. The circuit according to claim 9, wherein said bias current generating means includes means for varying the generated bias current in response to a control signal from a control signal source.

11. A dual modulus dividing circuit for dividing first and second complementary clock signals from a clock signal source to generate first and second complementary output signals related to the first and second clock signals by a first modulus and a second modulus in response to the first and second complementary modulus control signals from a control signal source, said dividing circuit comprising:

(a) first and second flip-flop circuits each including master and slave circuit means and each having first and second complementary flip-flop output signals for storing first and second complementary flip-flop input signals in response to the first and second complementary clock signals, the first and second output signals of the first flip-flop circuit being coupled to the first and second input signals of the second flip-flop circuit, respectively, the first and second output signals of the second flip-flop circuit coupled to the second and first input signals of the first flip-flop circuit, respectively, and said master and slave circuit means each having first and second complementary input signals and first and second complementary output signals, the first and second slave output signals providing the first and second flip-flop output signals, respectively, the first and second master input signals being coupled to the first and second flip-flop input signals, respectively, and the first and second slave input signals being coupled to the first and second master output signals;

(b) said master circuit means comprising:
  (i) first and second switching transistors each having emitter terminals intercoupled to one another, base terminals coupled to said second and first master output signals, respectively, and collector terminals providing said first and second master output signals, respectively;
  (ii) third and fourth switching transistors each having emitter terminals intercoupled to one another, base terminals coupled to said first and second master input signals, respectively, and collector terminals coupled to the collector terminals of the first and second switching transistors, respectively;
  (iii) fifth and sixth switching transistors each having emitter terminals intercoupled to one another, base terminals coupled to said first and second clock signals for said slave circuit means and to said second and first clock signals for said master circuit means, respectively, and collector terminals coupled to the intercoupled emitter terminals of the third and fourth switching transistors and the intercoupled emitter terminals of the first and second switching transistors, respectively; and
  (iv) first and second load means coupled between a power source and collector terminals of the first and second switching transistors, respectively, said first and second load means each being comprised of at least two series coupled, forward biased transistors interconnected to one another for continuously conducting current from said power source and each having an emitter terminal, a base terminal and a collector terminal connected to the base terminal;

(c) said slave circuit means comprising:
  (i) first and second switching transistors each having emitter terminals intercoupled to one another, base terminals coupled to said second and first slave output signals, respectively, and collector terminals providing said first and second slave output signals, respectively;
  (ii) third and fourth switching transistors each having emitter terminals intercoupled to one another, base terminals coupled to said first and second slave input signals, respectively, and collector terminals coupled to the collector terminals of the first and second switching transistors, respectively;
  (iii) fifth and sixth switching transistors each having emitter terminals intercoupled to one another, base terminals coupled to said first and second clock signals for said slave circuit means and to said second and first clock signals for said master circuit means, respectively, and collector terminals coupled to the intercoupled emitter terminals of the third and fourth switching transistors and the intercoupled emitter terminals of the first and second switching transistors, respectively; and
  (iv) first and second load means coupled between the power source and collector terminals of the first and second switching transistors, respectively, said first and second load means each being comprised of at least two series coupled, forward biased transistors interconnected to one another for continuously conducting current from said power source and each having an emitter terminal, a base terminal and a collector terminal connected to the base terminal; and (d) means coupled to the emitter terminals of the fifth and sixth switching transistors in the master and slave circuit means in the first and second flip-flop circuits for generating a predetermined bias current; and (e) a modulus control circuit coupled to a modulus control signal from a control signal source and being interposed between the intercoupled emitter terminals of the third and fourth switching transistors in the master circuit means in the first flip-flop circuit and the collector terminal of the fifth switching transistor in the master circuit means in the first flip-flop circuit, said modulus control circuit including seventh, eighth and ninth switching transistors each having base terminals, collector terminals and emitter terminals, the emitter terminals being intercoupled to one another, the base terminals of the seventh and eighth switching transistors being coupled to the first and second slave output signals in the first flip-flop circuit, the base terminal of the ninth switching transistor being coupled to the modulus control signal, the collector terminals of the seventh and ninth switching transistors being coupled to the intercoupled emitter terminals of the third and fourth switching transistors in the master circuit means in the first flip-flop circuit, the collector terminal of the eighth switching transistor being coupled to the collector terminal of the fourth switching transistor in the master circuit means in the first flip-flop circuit, and the emitter terminals of the seventh, eighth and ninth switching transistors being coupled to the collector terminal of the fifth switching transistor in the master circuit means in the first flip-flop circuit.

12. The dividing circuit according to claim 11, wherein siad bias current generating means includes means for varying the generated bias current in response to a control signal from a control signal source.

* * * * *